(12) United States Patent
Ankireddi et al.

(10) Patent No.: US 8,564,012 B2
(45) Date of Patent: Oct. 22, 2013

(54) OPTOELECTRONIC APPARATUSES AND METHODS FOR MANUFACTURING OPTOELECTRONIC APPARATUSES

(75) Inventors: Seshasayee S. Ankireddi, San Jose, CA (US); Lynn K. Wiese, Santa Clara, CA (US)

(73) Assignee: Intersil Americas LLC, Milpitas, CA (US)

( * ) Notice: Subject to any disclaimer, the term of this patent is extended or adjusted under 35 U.S.C. 154(b) by 22 days.

(21) Appl. No.: 13/431,466

(22) Filed: Mar. 27, 2012

(65) Prior Publication Data

US 2013/0207126 A1 Aug. 15, 2013

Related U.S. Application Data

(60) Provisional application No. 61/597,400, filed on Feb. 10, 2012.

(51) Int. Cl.
*H01L 33/00* (2010.01)
(52) U.S. Cl.
USPC .......... 257/100; 257/81; 257/88; 257/98; 257/99; 257/744; 257/745; 257/787; 257/E21.502; 257/E21.503; 257/E33.055; 257/E33.059; 257/E33.065; 257/E33.066; 438/25; 438/26; 438/28; 438/106; 438/110; 438/112; 438/118; 438/124; 438/127
(58) Field of Classification Search
USPC .......... 257/81, 88, 98, 99, 744, 745, 787, 257/E21.502, E21.503, E33.055, E33.059, 257/E33.065, E33.066; 438/25, 26, 28, 438/106, 110, 112, 118, 124, 127
See application file for complete search history.

(56) References Cited

U.S. PATENT DOCUMENTS

| | | | |
|---|---|---|---|
| 4,013,916 A | 3/1977 | Brown | |
| 6,003,676 A | 12/1999 | Beyer | |
| 6,518,600 B1* | 2/2003 | Shaddock | 257/98 |
| 6,682,331 B1 | 1/2004 | Peh et al. | |
| 7,727,817 B2 | 6/2010 | Xu et al. | |
| 2005/0133810 A1* | 6/2005 | Roberts et al. | 257/99 |
| 2006/0086943 A1 | 4/2006 | Wu et al. | |
| 2009/0072250 A1 | 3/2009 | Inoue | |
| 2009/0166665 A1* | 7/2009 | Haitko | 257/100 |
| 2009/0289349 A1* | 11/2009 | Novotny et al. | 257/698 |

(Continued)

OTHER PUBLICATIONS

"Quad-flat no-leads package," Wikipedia, http://en.wikipedia.org/wiki/Quad-flat_no-leads_package, date unknown (accessed Mar. 27, 2012).

*Primary Examiner* — Asok K Sarkar
(74) *Attorney, Agent, or Firm* — Vierra Magen Marcus LLP (57) ABSTRACT

A method for manufacturing an optoelectronic apparatus includes attaching bottom surfaces of first and second packaged optoelectronic semiconductor devices (POSDs) to a carrier substrate (e.g., a tape) so that there is a space between the first and second POSDs. An opaque molding compound is molded around portions of the first and second POSDs attached to the carrier substrate, so that peripheral surfaces of the first POSD and the second POSD are surrounded by the opaque molding compound, the space between the first and second POSDs is filled with the opaque molding compound, and the first and second POSDs are attached to one another by the opaque molding compound. The carrier substrate is thereafter removed so that electrical contacts on the bottom surfaces of the first and second POSDs are exposed. A window for each of the POSDs is formed during the molding process or thereafter.

22 Claims, 8 Drawing Sheets

(56) References Cited

U.S. PATENT DOCUMENTS

| | | |
|---|---|---|
| 2010/0188853 A1 | 7/2010 | Lee et al. |
| 2010/0195308 A1 | 8/2010 | Lin |
| 2011/0045618 A1 | 2/2011 | Kuhmann |
| 2011/0057108 A1 | 3/2011 | Yao et al. |
| 2011/0057129 A1 | 3/2011 | Yao et al. |
| 2011/0079812 A1 | 4/2011 | Park |
| 2011/0108866 A1* | 5/2011 | Lee et al. ........................ 257/98 |
| 2011/0186897 A1 | 8/2011 | Loh |
| 2011/0204233 A1* | 8/2011 | Costello et al. ............ 250/338.4 |
| 2011/0316032 A1* | 12/2011 | Ooyabu et al. ................... 257/98 |
| 2012/0032197 A1* | 2/2012 | Kurimoto ........................ 257/88 |
| 2012/0223231 A1* | 9/2012 | Nijaguna ................... 250/338.1 |
| 2013/0161668 A1* | 6/2013 | Mineshita ........................ 257/91 |

* cited by examiner

OPTOELECTRONIC APPARATUSES AND METHODS FOR MANUFACTURING OPTOELECTRONIC APPARATUSES

PRIORITY CLAIM

This application claims priority under 35 U.S.C. 119(e) to U.S. Provisional Patent Application No. 61/597,400, filed Feb. 10, 2012, which is incorporated herein by reference.

BACKGROUND

Optoelectronic apparatuses, such as an optical proximity sensor type apparatus, may include a light source and an adjacent photosensitive light detector. Such an optical proximity sensor can be used to detect the presence of an object, estimate proximity of an object and/or detect motion of an object, based on the magnitude and/or phase of light originating from the light source that is reflected from an object and detected by the light detector. The value of these sensors has become more important with the advent of battery-operated handheld devices, such as mobile phones. For example, a fair amount of the energy from a mobile phone battery is used to drive the display, and there is value in turning off the display or backlight when the mobile phone or other device is brought to the user's ear (where it cannot be viewed anyway). Optical proximity sensors, which are examples of optoelectronic apparatuses, have been used for this, and many other applications.

For other examples, there are many other applications in which the presence of an object can be detected with an optical proximity sensor to advantage. These range from sensing when protective covers have been opened on machinery, paper has been positioned correctly in a printer, or an operator's hands are at risk near an operating machine. An optical proximity sensor can also be used as a simple touch or near-touch activated switch, and could be implemented in applications like keyboards or devices that have a plastic housing that is sealed but which allows the light from the source to pass through and be sensed by the detector on the return.

Since more and more optoelectronic apparatuses are being integrated into products, such as mobile phones, there is a desire to provide smaller and cheaper optoelectronic apparatuses. Preferably, manufacturing of optical proximity sensors, as well as other optoelectronic apparatuses, should be relatively simple and should provide a high yield.

DETAILED DESCRIPTION

Figure 1A:
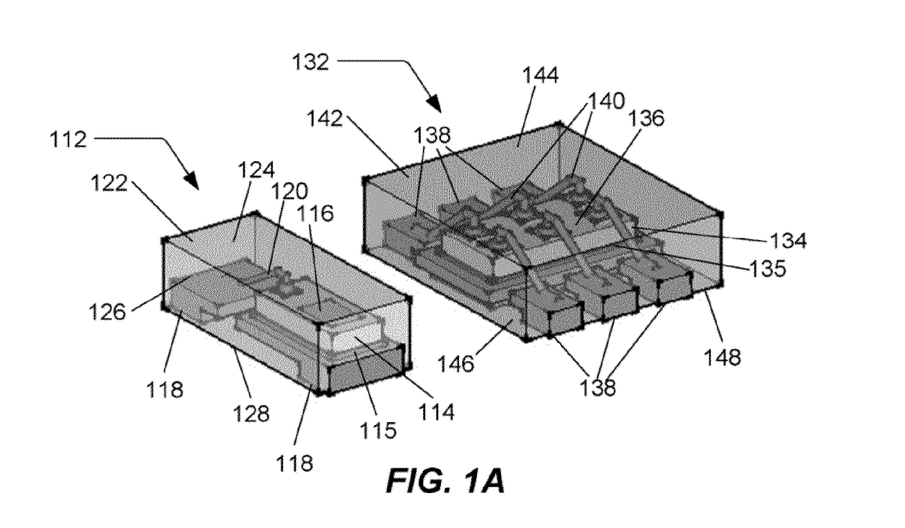
FIG. 1A shows a perspective view of an exemplary packaged light source semiconductor device (PLSSD), and a perspective view of an exemplary packaged light detector semiconductor device (PLDSD).
Figure 1B:
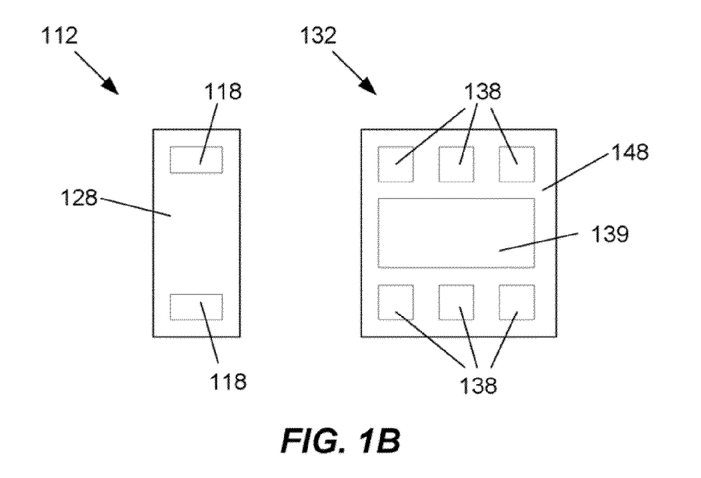
FIG. 1B shows a bottom view of the exemplary PLSSD shown in FIG. 1A, and a bottom view of the exemplary PLDSD shown in FIG. 1A.

FIG. 1A shows a perspective view of an exemplary packaged light source semiconductor device (PLSSD) 112, and a perspective view of an exemplary packaged light detector semiconductor device (PLDSD) 132. FIG. 1B shows a bottom view of the exemplary PLSSD 112 shown in FIG. 1A, and a bottom view of the exemplary PLDIC 132 shown in FIG. 1A. If the PLSSD 112 includes an integrated circuit, then it may alternatively be referred to as a packaged light source integrated circuit (PLSIC). Similarly, if the PLDSD 132 includes an integrated circuit, then it can alternatively be referred to as a packaged light detector integrated circuit (PLDIC). Both the PLSSD 112 and the PLDSD 132 can more generically be referred to as packaged optoelectronic semiconductor devices (POSDs).

The PLSSD 112 is shown as including a light source die 114 encapsulated within a light transmissive molding compound 122. The light source die 114 is shown as including one light emitting element 116, but can include more than one light emitting element 116. The light emitting element 116 can be a light emitting diode (LED), an organic LED (OLED), a bulk-emitting LED, a surface-emitting LED, a vertical-cavity surface-emitting laser (VCSEL), a superluminescent light emitting diode (SLED), a laser diode, or a pixel diode, but is not limited thereto. Light emitting elements, such as those mentioned above, are examples of optoelectronic elements.

The light transmissive molding compound 122 can be, e.g., a light transmissive epoxy (e.g., a clear or tinted epoxy), or other light transmissive resin or polymer. In certain embodiments, the light transmissive molding compound may have a pigment or other property that filters out light of certain wavelengths that are not of interest, while allowing light of wavelengths of interest to pass.

The light source die 114 is connected to electrical contacts 118 (which can alternatively be referred to as electrical connectors) by one or more die pads 115 below the die 114 and/or one or more bond wires 120. For example, one of the electrical contacts 118 can provide the contact for the anode(s) of the light emitting element(s) 116, while another one of the electrical contacts 118 can provide the contact for the cathode(s) of the light emitting element(s) 116. The light source die 114 can also include amplifier circuitry and/or other types of signal processing circuitry.

The PLSSD 112 includes a top surface 124, a bottom surface 128 and a peripheral surface 126 extending between the top surface 124 and the bottom surface 128. In this example, the top surface 124 of the PLSSD 112 is formed by a top surface of the light transmissive molding compound 122 (that encapsulates the light emitting element 116), and the peripheral surface 126 is formed by the four sides of the light transmissive molding compound 122. The bottom surface 128 includes the electrical contacts 118 for the light emitting element(s) 116, as best seen in FIG. 1B. The electrical contacts 118 can be, e.g., electrically conductive lands, electrically conductive pads, or electrically conductive balls, but are not limited thereto. For example, it is also possible that the electrical contacts 118 can be electrically conductive pins or wires. In this example, the PLSSD 112 includes two electrical contacts 118 on the bottom surface 128. In accordance with an embodiment, the PLSSD 112 is a flat no-leads package. In accordance with a specific embodiment, the electrical contacts 118 form a land grid array.

The PLDSD 132 is shown as including a light detector die 134 encapsulated within a light transmissive molding compound 142. The light detector die 134 is shown as including one light detecting element 136, but can include more than one light detecting element 136. The light detecting element 136 can be a photoresistor, a photovoltaic cell, a photodiode, a phototransistor, or a charge-coupled device (CCD), but is not limited thereto, and preferably can be used to produce a current or voltage indicative of the magnitude and/or phase of detected light. Light detecting elements, such as those mentioned above, are also examples of optoelectronic elements.

The light transmissive molding compound 142 can be, e.g., a light transmissive epoxy (e.g., a clear or tinted epoxy), or other light transmissive resin or polymer. In certain embodiments, the light transmissive molding compound may have a pigment or other property that filters out light of certain wavelengths that are not of interest, while allowing light of wavelengths of interest to pass. The light transmissive molding compound 142 of the PLDSD 132 can be the same as, or different than, the light transmissive molding compound 122 of the PLSSD 112.

The light detector die 134 is connected to electrical contacts 138 (which can alternatively be referred to as electrical connectors) by one or more die pads 135 below the die 134 and/or one or more bond wires 140. For example, one or more of the electrical contacts 138 can provide the contact for the anode(s) of the light detecting element(s) 136, while one or more further electrical contacts 138 can provide the contact for the cathode(s) of the light detecting element(s) 136. The light detector die 134 can also include amplifier circuitry, filter circuitry and/or other types of signal processing circuitry.

The PLDSD 132 includes a top surface 144, a bottom surface 148 and a peripheral surface 146 extending between the top surface 144 and the bottom surface 148. In this example, the top surface 144 of the PLDSD 132 is formed by a top surface of the light transmissive molding compound 142 (that encapsulates the light detecting element 136), and the peripheral surface 146 is formed by the four sides of the light transmissive molding compound 142. The bottom surface includes the electrical contacts 138 for the light detecting element(s) 136, as best seen in FIG. 1B. The electrical contacts 138 can be, e.g., electrically conductive lands, electrically conductive pads, or electrically conductive balls, but are not limited thereto. For example, it is also possible that the electrical contacts 138 can be electrically conductive pins or wires. In this example, the PLSSD 112 includes six electrical contacts 138 and an exposed thermal pad 139 on the bottom surface 148. The exposed pad 139 can alternatively, or additionally, be a ground plane for the PLDSD 132. In accordance with an embodiment, the PLDSD 132 is a flat no-leads package. In accordance with a specific embodiment, the electrical contacts 138 form a land grid array.

Figure 2A:
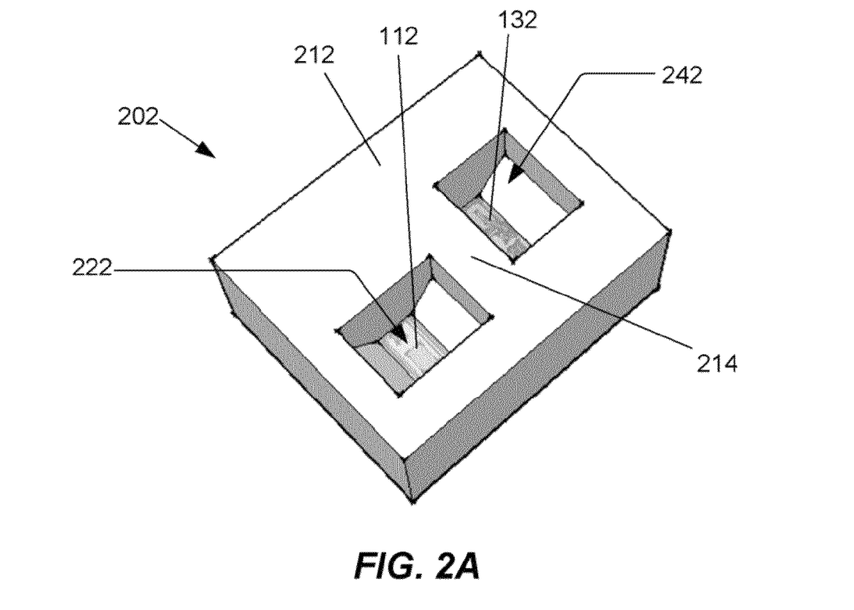
FIG. 2A is top perspective view of an optical proximity sensor apparatus according to an embodiment of the present invention.
Figure 2B:
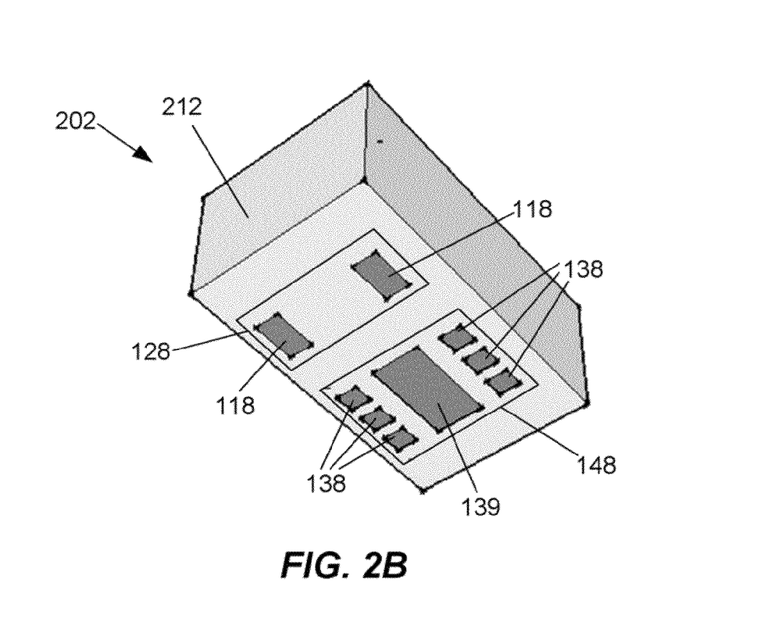
FIG. 2B is bottom perspective view of the optical proximity sensor apparatus of FIG. 2A.

Referring now to FIGS. 2A and 2B, in accordance with an embodiment of the present invention, an optical proximity sensor apparatus 202 includes the PLSSD 112, the PLDSD 132 and an opaque molding compound 212. More specifically, FIG. 2A is top perspective view of the optical proximity sensor apparatus 202, and FIG. 2B is bottom perspective view of the optical proximity sensor apparatus 202. As can be appreciated from FIGS. 2A and 2B, the opaque molding compound 212 surrounds and encapsulates the peripheral surface 126 of the PLSSD 112 and the peripheral surface 146 of the PLDSD 132. As can be best appreciated from FIG. 2A, the opaque molding compound 212 forms an opaque barrier 214 between the PLSSD 112 and the PLDSD 132 that optically isolates the light emitting element(s) 116 of the PLSSD 112 from the light detecting element(s) 136 of the PLDSD 132. Additionally, the opaque molding compound 212 physically attaches the PLSSD 112 and the PLDSD 132 to one another. Also shown in FIG. 2A is a window 222 formed over the light emitting element(s) of the PLSSD 112, and a window 242 formed over the light detecting element(s) of the PLDSD 132. As can be appreciated from FIG. 2B, the electrical contacts 118 of the PLSSD 112 and the electrical contacts 138 of the PLDSD 132 are exposed, and thus, are accessible for electrical connections to other circuitry. In addition to forming the barrier 214 between the PLSSD 112 and the PLDSD 132 (which optically isolates the two semiconductor devices from one another), the opaque molding compound 212 also forms a barrier around the entire periphery of the apparatus 202, so as to optically isolate the apparatus 202 from one or more other optoelectronic apparatus(es) that may be located in the vicinity of the apparatus 202. While the windows 222 and 242 are shown as being simple apertures or openings, more complex windows, such as windows including louvers, can be formed. The opaque molding compound 212 can be, e.g., a black or other dark epoxy, or other resin or polymer that is non-transmissive to the light generated by the PLSSD 112.

Figure 2C:
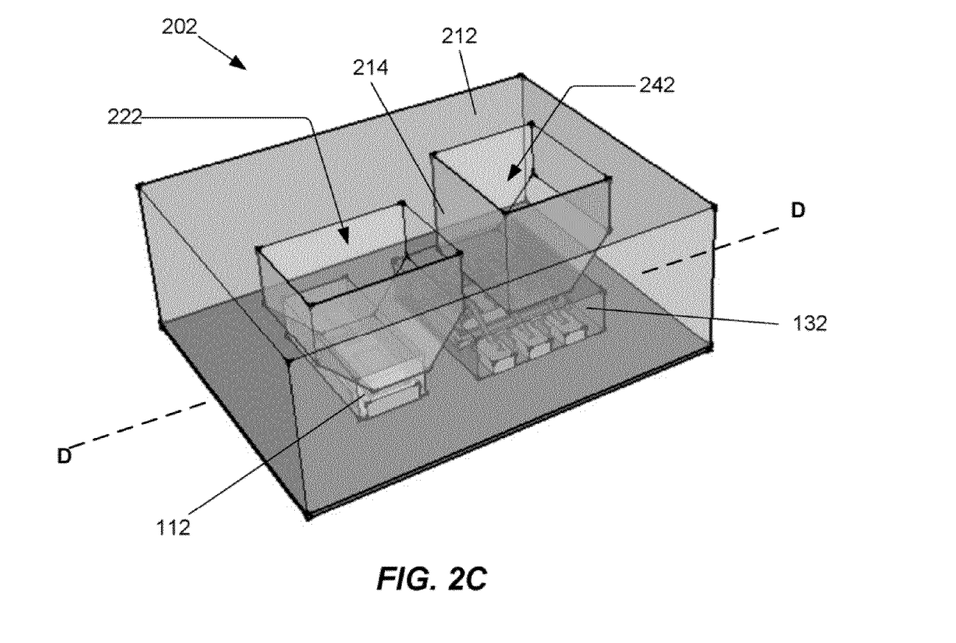
FIG. 2C is a further perspective view of the optical proximity sensor apparatus of FIGS. 2A and 2B.
Figure 2D:
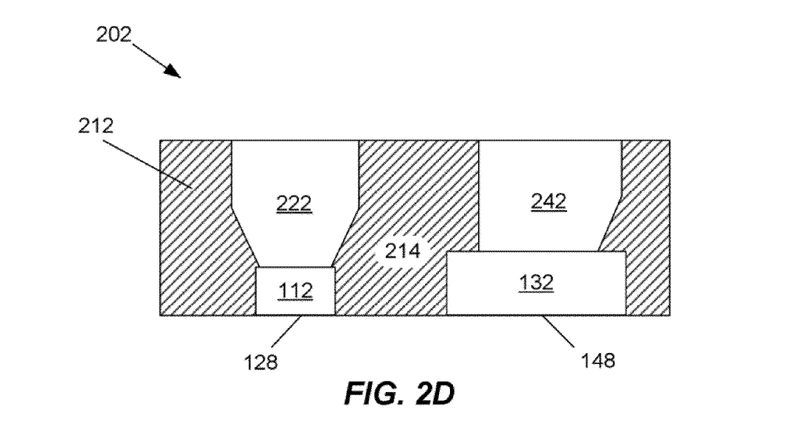
FIG. 2D is a cross section of the optical proximity sensor apparatus of FIGS. 2A-2C.

FIG. 2C is a further perspective view of the optical proximity sensor apparatus 202, which shows elements of the PLSSD 112 and the PLDSD 132 (previously described with reference to FIGS. 1A and 1B) that would not actually be viewable through the opaque molding compound 212, but which are nevertheless shown for illustrative purposes. FIG. 2D is a cross section, along line D-D in FIG. 2C, of the optical proximity sensor apparatus 202 of FIGS. 2A-2C.

While the optical proximity sensor apparatus 202 is shown as including the PLSSD 112 and the PLDSD 132 described with reference to FIGS. 1A and 1B, the optical proximity sensor apparatus 202 can include an alternative PLSSD and/or PLDSD, while being within the scope of the present invention. It is also possible that an optoelectronic apparatus in accordance with an embodiment of the present invention includes more than one PLSSD and/or more than one PLDSD, e.g., so that the apparatus can be used for gesture recognition, or the like. For another example, an optoelectronic apparatus according to an embodiment of the present invention can include one PLSSD 112 that is paired with a PLDSD 132 for the purpose of proximity detection, as well as a second PLDSD 132 that is dedicated to ambient light detection. These are just a few examples of types of optoelectronic apparatuses that can be manufactured in accordance with embodiments of the present invention.

One useful feature of the optical proximity sensor apparatus 202 is that the PLSSD 112 and the PLDSD 132 are physically attached to one another without the need for a substrate (e.g., a PCB) that is at least partially dedicated to providing such attachment. A benefit of this feature is that it can reduce the total height, volume and weight of the resulting optoelectronic apparatus, and can reduce the cost of manufacturing this and other optoelectronic apparatuses.

Another useful feature of the optical proximity sensor apparatus 202 is that the same opaque molding compound 212 that is being used to physically attach the PLSSD 112 and the PLDSD 132 to one another, is also being used to provide the barrier that optically isolates the light emitting element(s) 116 of the PLSSD 112 from the light detecting element(s) 136 of the PLDSD 132. This can also reduce the cost of, and amount of time required for, manufacturing this and other optoelectronic apparatuses.

Embodiments of the present are also directed to methods for manufacturing the optical proximity sensor apparatus 202, similar optical proximity sensor apparatuses, as well as other types of optoelectronic apparatuses. Such manufacturing methods shall now be explained with reference to FIGS. 3A-3D and 4A-4B.

Figure 3A:
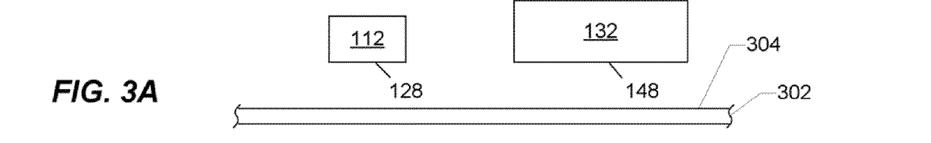
FIGS. 3A-3E are used to describe methods for manufacturing optical proximity sensor apparatuses according to certain embodiments of the present invention.

FIG. 3A shows the PLSSD 112 and the PLDSD 132 above a carrier substrate 302. As explained above, the PLSSD 112 and the PLDSD 132 each includes a top surface, a bottom surface and a peripheral surface extending between the top and bottom surfaces. As also explained above, the PLSSD 112 and the PLDSD 132 each includes electrical contacts on its bottom surface. In accordance with an embodiment, the PLSSD 112 and the PLDSD 132, and/or other types of POSDs, are tested prior to be attached to the carrier substrate 302.

The carrier substrate 302, in accordance with an embodiment, is a tape having an adhesive surface 304. The carrier substrate 302 can alternatively be a film or foil having an adhesive surface. Since, as explained below, a opaque molding compound (212) will be molded around the PLSSD 112 and the PLDSD 132 attached to the tape (or other carrier substrate), the tape (or other carrier substrate) should be able to withstand the high temperatures of the molten molding compound without melting or otherwise being damaged. For example, the tape can be made from polyimide (PI), polyvinylchloride (PVC), or can be a polyolefin-based material, but is not limited thereto. Exemplary polyimide tapes and films are made by DuPont (headquartered in Wilmington, Del., USA) and marketed under the trademark Kapton™. Alternatively, the carrier substrate 302 can be some other type of removable substrate having an adhesive surface. The adhesive can be a silicon based adhesive, but is not limited thereto.

Figure 3B:
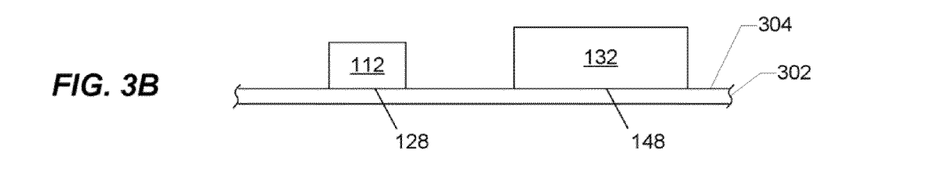

FIG. 3B shows that the bottom surfaces of the PLSSD and the PLDSD are attached to the carrier substrate 302 so that there is a space between the PLSSD 112 and the PLDSD 132. While only one PLSSD/PLDSD pair is shown in FIG. 3B, most likely dozens and potentially hundreds of such pairs are attached to the same carrier substrate 302, as mentioned above. For example, N columns×M rows (e.g., 15×20) of such pairs can be attached to a same carrier substrate (e.g., tape) such that N×M apparatuses (e.g., 15×20=300 apparatuses) can be manufactured at the same time, where N and M are each integers that are greater than or equal to one, and N and M can be the same or different from one another. As described above, alternatively more than two packaged optoelectronic semiconductor devices can be included in each apparatus.

While not as practical, it is possible that the carrier substrate 302 does not have an adhesive surface, in which case the bottom surfaces of the PLSSD 112 and the PLDSD 132 can be attached to the carrier substrate 302 using an adhesive that is dispensed directly onto the PLSSD 112 and the PLDSD 132 and/or the carrier substrate 302.

Figure 3C:
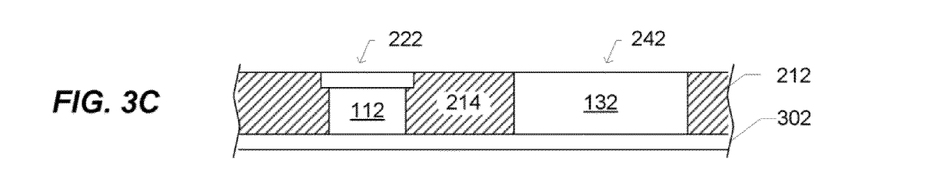

FIG. 3C shows that the opaque molding compound 212 is molded around portions of the PLSSD 112 and the PLDSD 132 attached to the carrier substrate 302, so that the peripheral surfaces of the PLSSD 112 and the PLDSD 132 are surrounded by the opaque molding compound 212. FIG. 3C also shows that the space between the PLSSD 112 and the PLDSD 132 is filled with the opaque molding compound 212 to form the opaque barrier 214. As can also be appreciate from FIG. 3C, the PLSSD 112 and the PLDSD 132 are attached to one another by the opaque molding compound 212. In the embodiment being described with reference to FIG. 3C, a portion of a mold (into which the molding compound 212 is injected) contacts the top surface of the PLDSD 132 so that the window 242 is formed over the one or more light detecting elements of the PLDSD 132. Similarly, a portion of the mold contacts the top surface of the PLDSD 132 so that the window 222 is formed over the one or more light emitting elements of the PLSSD 112. While only one PLSSD/PLDSD pair is shown in FIG. 3C, the above described molding is most likely being simultaneously performed for dozens and potentially hundreds of such pairs that are all attached to the same carrier substrate 302. The mold that is used to perform the molding using the opaque molding compound 212 can be coated with a material, such as Teflon™ or silicon rubber, to enable the resulting overmolded structure to be more easily removed from the mold. Molding techniques that can be used include, but are not limited to, injection molding, compression molding, transfer molding and cast molding.

Figure 3D:
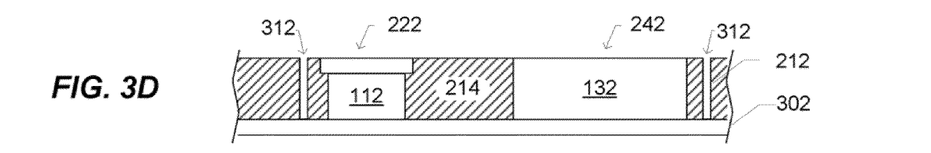

FIG. 3D shows that the opaque molding compound 212 is cut through at 312 (where 312 can also be referred to as a cut) to separate the PLSSD 112 and the PLDSD 132 from other PLSSD/PLDSD pairs, so that a resulting optoelectronic apparatus includes the PLSSD 112 and the PLDSD 132 attached to one another and optically isolated from one another by the opaque molding compound 212. Such cutting can be performed using a saw, blade or laser, but is not limited thereto. In accordance with an embodiment, the cutting is performed such that the opaque molding compound 212 is cut through, without cutting through the carrier substrate 302, as shown in FIG. 3D. Alternatively, the cutting can be performed such that the opaque molding compound 212 and the carrier substrate 302 are both cut through.

Figure 3E:
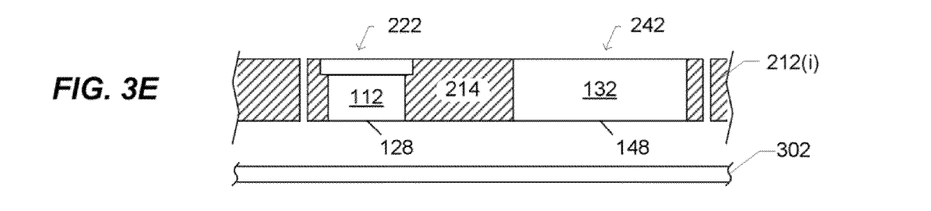

FIG. 3E shows that the carrier substrate 302 is removed. This exposes the electrical contacts 118 (shown in FIG. 1B) on the bottom surface 128 of the PLSSD 112, and exposes the electrical contacts 138 and the thermal pad and/or ground plane 139 (shown in FIG. 1B) on the bottom surface 148 of the PLDSD 132. The carrier substrate 302 (e.g., tape) can be removed by simply pealing it off, using a solvent to remove the adhesive, or through use of vibration or the like, but is not limited thereto. In an alternative embodiment, the carrier substrate 302 is removed prior to the cutting described above. In accordance with an embodiment, the resulting optoelectronic apparatus(es) (e.g., 202) is/are tested before or after the cutting, but most likely after the carrier substrate is removed, so that the electrical contacts can be more readily accessed during the testing.

Figure 4A:
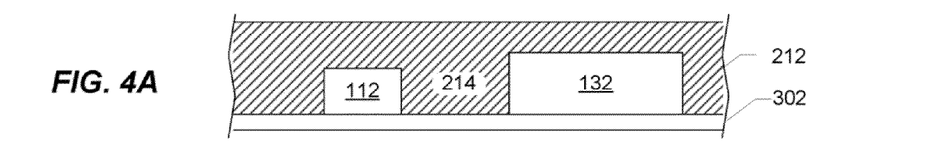
FIGS. 4A and 4B are used to describe methods for manufacturing optical proximity sensors apparatuses according to alternative embodiments of the present invention.

As can be appreciated from FIG. 4A, the molding can alternatively be performed such that the one or more light emitting elements of the PLSSD 112 are covered by the opaque molding compound 212 and/or the one or more light detecting elements of the PLDSD 132 are covered by the opaque molding compound 212. Thereafter, a portion of the opaque molding compound covering the one or more light emitting elements is removed to form the window 222 over the one or more light emitting elements of the PLSSD 112 and/or a portion of the opaque molding compound covering the one or more light detecting elements to form the window 242 over the one or more light detecting elements of the PLDSD 132, as can be appreciated from the 4B. The removing to form the window(s) can be by etching, developing, stripping or some other technique. The steps described with reference to FIGS. 4A and 4B can be performed in place of the step described with reference to FIG. 3C.

Figure 4B:
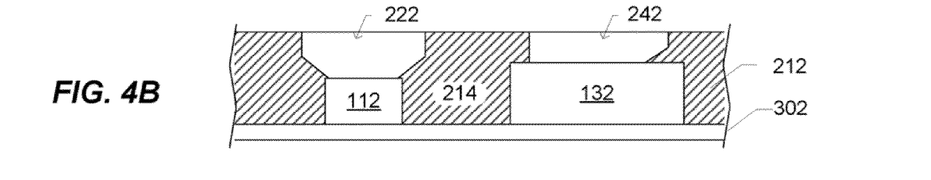

Referring back to FIG. 3C, the cross section of the resulting optical sensor apparatus can alternative look like the cross section shown in FIG. 2D or 4B. Other cross sections are possible, by using the alternative molds and/or removing the molding compound to form alternative shaped windows.

Methods for manufacturing optoelectronic apparatuses that include more than one PLSSD and/or more than one PLDSD, e.g., so that the device can be used for gesture recognition, or the like, are also within the scope of embodiments the present invention. It is also within the scope of embodiments of the present invention to use similar methods to those described above to produce other types of optoelectronic apparatuses that include at least two packaged optoelectronic semiconductor devices (POSDs).

Figure 5:
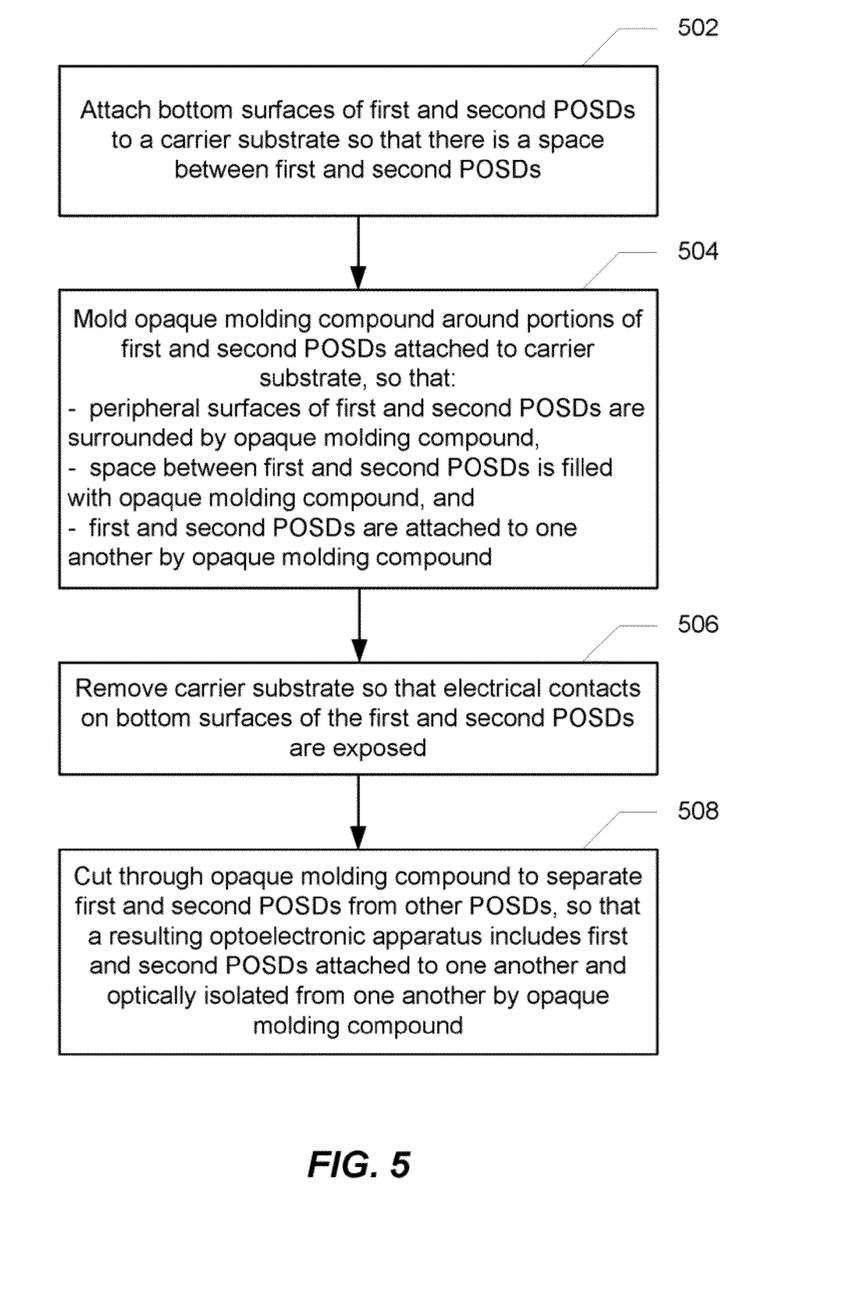
FIG. 5 is a high level flow diagram that is used to summarize methods for manufacturing an optoelectronic apparatus, according to various embodiments of the present invention.

FIG. 5 is a high level flow diagram that is used to summarize methods for manufacturing an optoelectronic apparatus, according to various embodiments of the present invention. For the following description, it will be assumed that the optoelectronic apparatus includes a first packaged optoelectronic semiconductor devices (POSD) and a second POSD. However, as described above, an optoelectronic apparatus can include more than two POSDs. As was also described above, each POSD includes a top surface, a bottom surface and a peripheral surface extending between the top and bottom surfaces. Additionally, each POSD includes one or more optoelectronic elements encapsulated by a light transmissive molding compound. Further, each POSD includes electrical contacts on its bottom surface.

Referring to FIG. 5, at step 502, the bottom surfaces of the first and second POSDs are attached to a carrier substrate (e.g., a tape having an adhesive surface) so that there is a space between the first POSD and the second POSD.

At step 504, an opaque molding compound is molded around portions of the first and second POSDs attached to the carrier substrate, so that the peripheral surfaces of the first POSD and the second POSD are surrounded by the opaque molding compound, the space between the first POSD and the second POSD is filled with the opaque molding compound, and the first and second POSDs are attached to one another by the opaque molding compound.

At step 506, the carrier substrate (e.g., tape) is removed so that the electrical contacts on the bottom surfaces of the first and second POSDs are exposed. As mentioned above, the carrier substrate can be removed by pealing it off, using a solvent, or using vibration, but is not limited thereto.

At step 508, the opaque molding compound is cut through to separate the first and second POSDs from other POSDs, so that a resulting optoelectronic apparatus includes the first and second POSDs attached to one another and optically isolated from one another by the opaque molding compound. In an alternative embodiment, the order of steps 506 and 508 are reversed. As also explained above, each optoelectronic apparatus being manufacture can include more than two POSDs.

In accordance with specific embodiments, the molding at step 504 is performed such that a first window is formed over the one or more optoelectronic elements of the first POSD, and a second window is formed over the one or more optoelectronic elements of the second POSD.

In specific embodiments, the method described with reference to FIG. 5 can be used to produce an optical proximity sensor type of optoelectronic apparatus. In such embodiments, the one or more optoelectronic elements of the first POSD is/are one or more light emitting elements, and the one or more optoelectronic elements of the second POSD is/are one or more light detecting elements. Further, in such embodiments the molding at step 504 can be performed such that the first window is formed over the one or more light emitting elements of the first POSD, and the second window is formed over the one or more light detecting elements of the second POSD.

As was described above with reference to FIGS. 4A and 4B, the molding at step 504 can alternatively be performed such that the one or more optoelectronic elements of the first POSD is/are covered by the opaque molding compound. Additionally, or alternatively, the molding at step 504 can be performed such that the one or more optoelectronic of the second POSD is/are covered by the opaque molding compound. In such embodiments, after step 504 and before step 506, at least a portion of the opaque molding compound covering the one or more optoelectronic elements of the first POSD is removed to form a window over the one or more optoelectronic of the first POSD. Additionally, or alternatively, at least a portion of the opaque molding compound covering the one or more optoelectronic elements of the second POSD is removed to form a window over the one or more optoelectronic elements of the second POSD. Such removing of the opaque molding compound, to form one or more windows, can be performed by etching, developing, stripping, or some other technique.

As was mentioned above, the optoelectronic apparatus being manufactured can also includes one or more additional POSDs. Accordingly, step 502 can also include attaching the bottom surface of the one or more additional POSDs to the carrier substrate. Step 504 can also includes molding the opaque molding compound around portions of the one or more additional POSDs attached to the carrier substrate. Step 506 can also include removing the carrier substrate so that the electrical contacts on the bottom surfaces of the one or more additional POSDs are exposed. In such embodiments, step 508 can include cutting through the opaque molding compound to separate the first, second and one or more additional POSDs from other POSDs, so that a resulting optoelectronic apparatus includes the first, second and one or more additional POSDs attached to one another and optically isolated from one another by the opaque molding compound.

Figure 6:
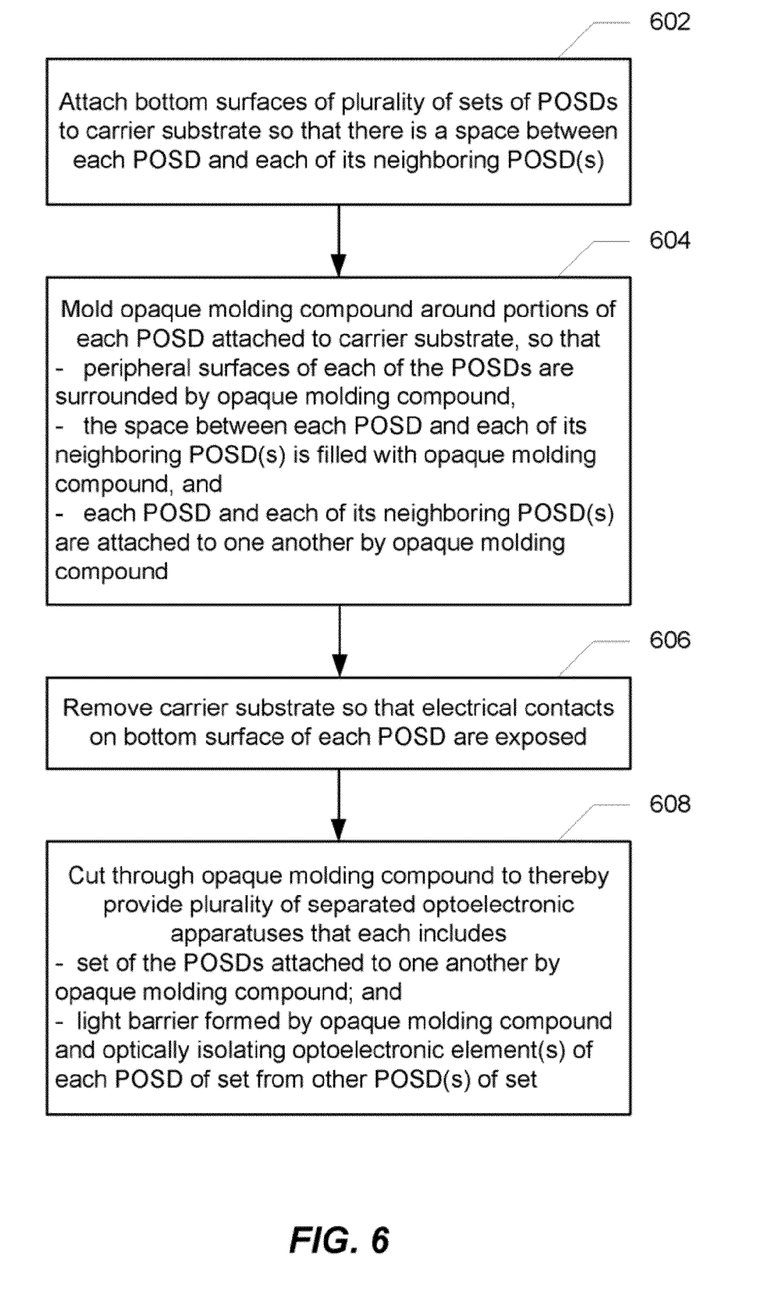
FIG. 6 is a high level flow diagram that is used to summarize methods for manufacturing multiple optoelectronic apparatus simultaneously, according to various embodiments of the present invention.

FIG. 6 is a high level flow diagram that is used to summarize methods for manufacturing multiple optoelectronic apparatus simultaneously, according to various embodiments of the present invention. Each such optoelectronic apparatus includes a set of (i.e., two or more) optoelectronic semiconductor devices (POSDs).

Referring to FIG. 6, at step 602 the bottom surfaces of a plurality of the sets of the POSDs are attached to a carrier substrate (e.g., a tape having an adhesive surface) so that there is a space between each POSD and each of its one or more neighboring POSD(s).

At step 604, an opaque molding compound is molded around portions of each of the POSDs attached to the carrier substrate, so that the peripheral surface of each of the POSDs is surrounded by the opaque molding compound, the space between each POSD and each of its one or more neighboring POSD(s) is filled with the opaque molding compound, and each POSD and each of its one or more neighboring POSD(s) are attached to one another by the opaque molding compound.

At step 606, the carrier substrate is removed so that the electrical contacts on the bottom surfaces of each of the POSDs are exposed.

At step 608, the opaque molding compound is cut through to thereby provide a plurality of separated optoelectronic apparatuses that each includes a set of the POSDs attached to one another by the opaque molding compound, and a light barrier formed by the opaque molding compound and optically isolating optoelectronic element(s) of each POSD of the set from other POSD(s) of the set. In an alternative embodiment, steps 606 and 608 can be reversed. Additional details of the steps of FIG. 6, as well as the steps of FIG. 5, can be appreciated from the description provided above.

Figure 7:
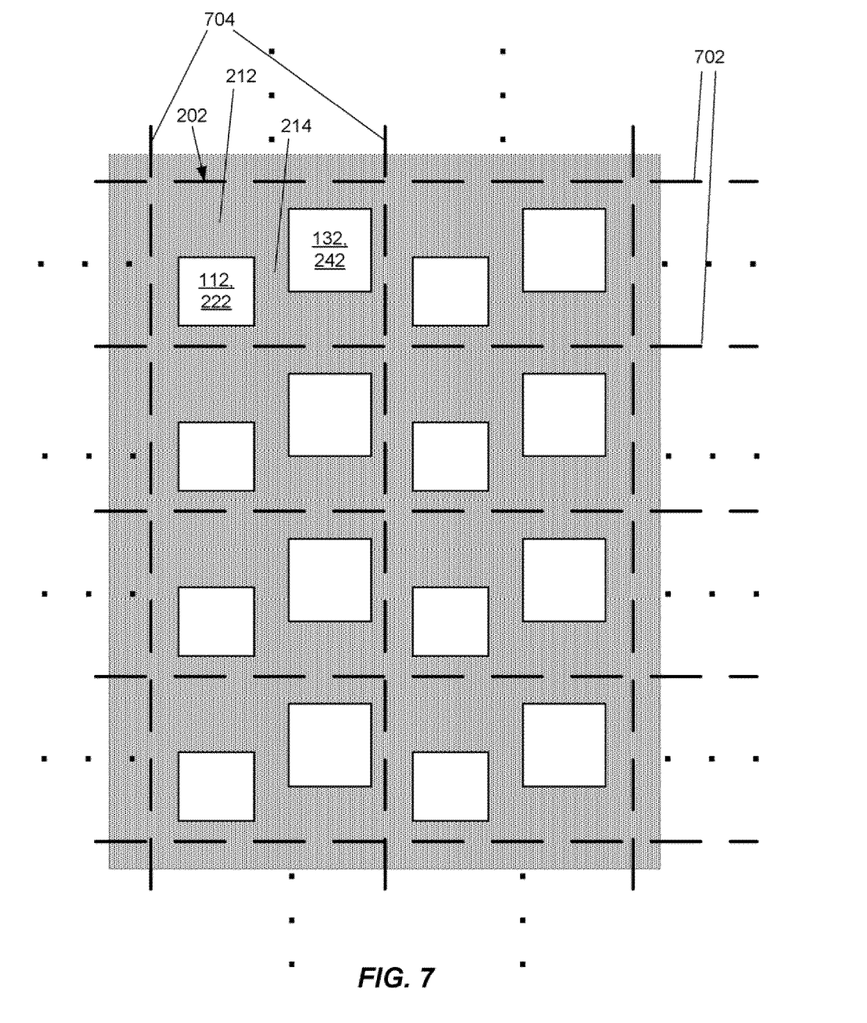
FIG. 7 illustrates how a plurality of the sets of the POSDs can be used to manufacture a plurality of optoelectronic apparatus, in accordance with various embodiments of the present invention.

FIG. 7, illustrates an exemplary top view of a plurality of the sets of the POSDs, which each set of POSDs including one packaged light source semiconductor device (PLSSD) 112 and one packaged light detector semiconductor device (PLDSD) 132. The opaque molding compound 212 is molded around portions of each of the POSDs (attached to the carrier substrate 302), so that the peripheral surface of each of the POSDs is surrounded by the opaque molding compound 212, the space between each POSD and each of its one or more neighboring POSD(s) is filled with the opaque molding compound 212, and each POSD and each of its one or more neighboring POSD(s) are attached to one another by the opaque molding compound 212. A window 222 is formed over the light emitting element(s) of each PLSSD 112 type of POSD, and a window 242 is formed over the light detecting element(s) of each PLDSD 132 type of POSD.

By cutting along horizontal dashed lines 702 and vertical dashed lines 704, the result is plurality of separated optoelectronic apparatuses that each includes a set of the POSDs. As mentioned above, such cutting can be performed using a saw, blade or laser, but is not limited thereto. The cutting can be performed before or after the carrier substrate (e.g., 302) is removed. Where the cutting is performed before the carrier substrate is removed, the cutting can be performed such that the opaque molding compound 212 is cut through, without cutting through the carrier substrate. Alternatively, the cutting can be performed such that the opaque molding compound 212 and the carrier substrate are both cut through. More generally, the POSDs can be separated by sawing or another method, into individual subassemblies, or groups of subassemblies, to yield a final product.

In the example of FIG. 7, each separated optoelectronic apparatus is an optical proximity sensor 202 that includes one PLSSD 112 and one PLDSD 132 attached to one another by the opaque molding compound 212. The light barrier 214 formed by the opaque molding compound 212 optically isolates the light emitting elements of the PLSSD 112 from the light detecting element(s) of the PLDSD 132. As explained above, alternatives types of optoelectronic apparatuses can be manufactured using the techniques described herein.

Figure 8:
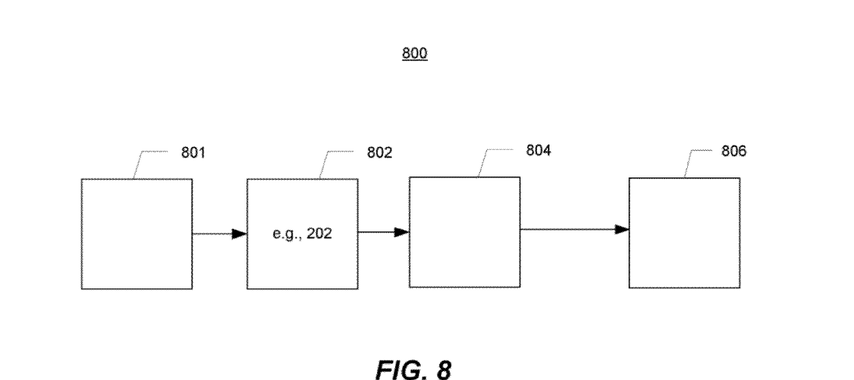
FIG. 8 is a high level block diagram of a system according to an embodiment of the present invention.

Optoelectronic apparatuses of embodiments of the present invention can be used in various systems, including, but not limited to, mobile phones, tablets, personal data assistants, laptop computers, netbooks, other handheld-devices, as well as non-handheld-devices. Referring to the system 800 of FIG. 8, for example, an optoelectronic apparatus 802 (e.g., the optical proximity sensor apparatus 202) can be used to control whether a subsystem 806 (e.g., a touch-screen, display, backlight, virtual scroll wheel, virtual keypad, navigation pad, etc.) is enabled or disabled. For example, the optoelectronic apparatus can detect when an object, such as a person's finger, is approaching, and based on the detection either enable (or disable) a subsystem 806. More specifically, an output of the optoelectronic apparatus (e.g., the optical proximity sensor apparatus 202) can be provided to a comparator or processor 804 which can, e.g., compare the output of the optical sensor to a threshold, to determine whether the object is within a range where the subsystem 806 should be enabled (or disabled, depending on what is desired). Multiple thresholds (e.g., stored digital values) can be used, and more than one possible response can occur based on the detected proximity of an object. For example, a first response can occur if an object is within a first proximity range, and a second response can occur if the object is within a second proximity range. Exemplary responses can include starting or stopping, or enabling or disabling, various system and/or subsystem Where the optoelectronic apparatus 802 is used for ambient light detection, the comparator or processor 804 can determine how to adjust the brightness of a subsystem 806 (e.g., a display or backlight). FIG. 8 also shows that a driver 801 can selectively drive one or more light emitting elements of the packaged light source semiconductor device(s) of the optoelectronic apparatus 802.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A method for manufacturing an optoelectronic apparatus including first and second packaged optoelectronic semiconductor devices (POSDs),
   wherein each POSD includes one or more optoelectronic elements encapsulated by a light transmissive molding compound,
      wherein each POSD includes a top surface, a bottom surface and a peripheral surface extending between the top and bottom surfaces, and
      wherein each POSD includes electrical contacts on its bottom surface, the method comprising:
   (a) attaching the bottom surfaces of the first and second POSDs to a carrier substrate so that there is a space between the first and second POSDs;
   (b) molding an opaque molding compound around portions of the first and second POSDs attached to the carrier substrate, so that
      the peripheral surfaces of the first and second POSDs are surrounded by the opaque molding compound,
      the space between the first and second POSDs is filled with the opaque molding compound, and
      the first and second POSDs are attached to one another by the opaque molding compound; and
   (c) removing the carrier substrate so that the electrical contacts on the bottom surfaces of the first and second POSDs are exposed.

2. The method of claim 1, wherein:
   the molding at step (b) is performed such that a first window is formed over the one or more optoelectronic elements of the first POSD; and
   a second window is formed over the one or more optoelectronic elements of the second POSD.

3. The method of claim 2, wherein:
   the optoelectronic apparatus comprises an optical proximity sensor;
   the one or more optoelectronic elements of the first POSD comprises one or more light emitting elements; and the one or more optoelectronic elements of the second POSD comprises one or more light detecting elements; and the molding at step (b) is performed such that
the first window is formed over the one or more light emitting elements of the first POSD; and
the second window is formed over the one or more light detecting elements of the second POSD.

4. The method of claim 1, wherein:
the molding at step (b) is performed such that
the one or more optoelectronic elements of the first POSD is/are covered by the opaque molding compound; and/or
the one or more optoelectronic of the second POSD is/are covered by the opaque molding compound; and
further comprising, after step (b) and before step (c)
removing at least a portion of the opaque molding compound covering the one or more optoelectronic elements of the first POSD to form a first window over the one or more optoelectronic of the first POSD; and/or
removing at least a portion of the opaque molding compound covering the one or more optoelectronic elements of the second POSD to form a second window over the one or more optoelectronic elements of the second POSD;
wherein the removing to form the first window and/or the second window is performed by etching, developing, stripping, or some other technique.

5. The method of claim 1, further comprising, after step (b), and either before or after step (c):
cutting through the opaque molding compound to separate the first and second POSDs from other POSDs, so that a resulting optoelectronic apparatus includes the first and second POSDs attached to one another and optically isolated from one another by the opaque molding compound.

6. The method of claim 1, wherein:
the carrier substrate comprises tape having an adhesive surface;
step (a) comprises attaching the bottom surfaces of the first and second POSDs to the adhesive surface of the tape so that there is the space between the first and second POSDs; and
step (c) comprises removing the tape so that the electrical contacts on the bottom surfaces of the first and second POSDs are exposed.

7. The method of claim 1, wherein:
the optoelectronic apparatus being manufactured also includes one or more additional POSDs;
step (a) also includes attaching the bottom surface(s) of the one or more additional POSDs to the carrier substrate;
step (b) also includes molding the opaque molding compound around portions of the one or more additional POSDs attached to the carrier substrate;
step (c) also includes removing the carrier substrate so that the electrical contacts on the bottom surface(s) of the one or more additional POSDs are exposed; and
further comprising, after step (b), and either before or after step (c), cutting through the opaque molding compound to separate the first, second and one or more additional POSDs from other POSDs, so that a resulting optoelectronic apparatus includes the first, second and one or more additional POSDs attached to one another and optically isolated from one another by the opaque molding compound.

8. An optoelectronic apparatus, comprising:
first and second packaged optoelectronic semiconductor devices (POSDs) each including
one or more optoelectronic elements encapsulated by a light transmissive molding compound;
a top surface formed by a top surface of the light transmissive molding compound that encapsulates the one or more optoelectronic elements of the POSD;
a bottom surface including electrical contacts for the one or more optoelectronic elements of the POSD; and
a peripheral surface extending between the top and bottom surfaces;
an opaque molding compound that surrounds the peripheral surfaces of the first and second POSDs, optically isolates the one or more optoelectronic elements of the first POSD from the one or more optoelectronic elements of the second POSD, and attaches the first and second POSDs to one another;
a first window formed over the one or more optoelectronic elements of the first POSD; and
a second window formed over the one or more optoelectronic elements of the second POSD;
wherein the electrical contacts of the first POSD and the electrical contacts of the second POSD are exposed, and thus, are accessible for electrical connections to other circuitry.

9. The optoelectronic apparatus of claim 8, wherein:
the bottom surface of each POSD, which includes the electrical contacts for the one or more optoelectronic elements of the POSD, comprises a bottom surface of a printed circuit board (PCB) or leadframe, with the one or more optoelectronic elements of the POSD being connected to a top surface of the PCB or leadframe.

10. The optoelectronic apparatus of claim 8, wherein the electrical contacts on the bottom surface of each POSD are selected from the group consisting of:
electrically conductive lands;
electrically conductive pads;
electrically conductive balls;
electrically conductive pins; and
electrically conductive wires.

11. The optoelectronic apparatus of claim 8, wherein each POSD comprises a flat no-leads package.

12. The optoelectronic apparatus of claim 8, wherein:
the first POSD comprises a packaged light source semiconductor device;
the second POSD comprises a packaged light detector semiconductor device;
the one or more optoelectronic elements of the first POSD comprises one or more light emitting elements;
the one or more optoelectronic elements of the second POSD comprises one or more light detecting elements;
the first window is formed over the one or more light emitting elements of the first POSD; and
the second window is formed over the one or more light detecting elements of the second POSD.

13. The optoelectronic apparatus of claim 12, wherein the optoelectronic apparatus is an optical proximity sensor that can be used to detect the presence, proximity and/or motion of an object within the sense region of the optical proximity sensor.

14. The optoelectronic apparatus of claim 12, further comprising:
at least one additional packaged light source semiconductor device and/or at least one additional packaged light detector semiconductor device; and wherein the optoelectronic apparatus comprises
an optical gesture recognition sensor that can be used to detect a plurality of different gestures; or
both an optical proximity sensor and an ambient light sensor, wherein the optical proximity sensor can be used to detect the presence, proximity and/or motion of an object within the sense region of the optical proximity sensor.

15. A method for manufacturing a plurality of optoelectronic apparatuses, each of which includes
a set of optoelectronic semiconductor devices (POSDs), wherein each POSD includes
one or more optoelectronic elements encapsulated by a light transmissive molding compound;
a top surface formed by a top surface of the light transmissive molding compound that encapsulates the one or more optoelectronic elements of the POSD;
a bottom surface including electrical contacts for the one or more optoelectronic elements of the POSD; and
a peripheral surface extending between the top and bottom surfaces; and
wherein each set of POSDs includes at least two POSDs, the method comprising:
(a) attaching the bottom surfaces of a plurality of the sets of the POSDs to a carrier substrate so that there is a space between each POSD and each of its one or more neighboring POSD(s);
(b) molding an opaque molding compound around portions of each of the POSDs attached to the carrier substrate, so that
the peripheral surface of each of the POSDs is surrounded by the opaque molding compound,
the space between each POSD and each of its one or more neighboring POSD(s) is filled with the opaque molding compound, and
each POSD and each of its one or more neighboring POSD(s) are attached to one another by the opaque molding compound; and
(c) removing the carrier substrate so that the electrical contacts on the bottom surface of each of the POSDs are exposed.

16. The method of claim 15, further comprising, after step (b), and either before or after step (c):
cutting through the opaque molding compound to thereby provide a plurality of separated optoelectronic apparatuses that each includes
a said set of the POSDs attached to one another by the opaque molding compound; and
a light barrier formed by the opaque molding compound and optically isolating optoelectronic element(s) of each POSD of the set from other POSD(s) of the set.

17. The method of claim 16, wherein the molding at step (b) is performed such that a window is formed over the one or more optoelectronic elements of each POSD.

18. The method of claim 16, wherein:
the molding at step (b) is performed such that the one or more optoelectronic elements of at least one of the POSDs is/are covered by the opaque molding compound; and
further comprising, for each POSD having its one or more optoelectronic elements covered by the opaque molding compound, removing at least a portion of the opaque molding compound covering the one or more optoelectronic elements to form a window over the one or more optoelectronic of the POSD.

19. A system, comprising:
an optoelectronic apparatus including
a packaged light source semiconductor device including
one or more light emitting elements encapsulated by a light transmissive molding compound;
a top surface formed by a top surface of the light transmissive molding compound that encapsulates the one or more light emitting elements;
a bottom surface including electrical contacts for the one or more light emitting elements; and
a peripheral surface extending between the top and bottom surfaces;
a packaged light detector semiconductor device including
one or more light detecting elements encapsulated by a light transmissive molding compound;
a top surface formed by a top surface of the light transmissive molding compound that encapsulates the one or more light detecting elements;
a bottom surface including electrical contacts for the one or more light detecting elements; and
a peripheral surface extending between the top and bottom surfaces;
an opaque molding compound that surrounds the peripheral surfaces of the packaged light source semiconductor device and the packaged light detector semiconductor device, optically isolates the one or more light emitting elements of the packaged light source semiconductor device from the one or more light detecting elements of the packaged light detector semiconductor device, and attaches the packaged light source semiconductor device and the packaged light detector semiconductor device to one another;
a first window formed over the one or more light emitting elements of the packaged light source semiconductor device; and
a second window formed over the one or more light detecting elements of the packaged light detector semiconductor device;
wherein the electrical contacts of the packaged light source semiconductor device and the electrical contacts of the packaged light detector semiconductor device are exposed, and thus, are accessible for electrical connections to other circuitry.

20. The system of claim 19, further comprising:
a driver to selectively drive one or more light emitting elements of the packaged light source semiconductor device;
a processor and/or circuitry to detect proximity of an object, if any, relative to the optical optoelectronic apparatus; and
a subsystem that is responsive to proximity of an object, if any, relative to the optoelectronic apparatus, as detected by the processor and/or circuitry.

21. The system of claim 20, further comprising:
a printed circuit board (PCB);
wherein each of the optoelectronic apparatus, the driver, the processor and/or circuitry to detect proximity of an object, and the subsystem, is connected to the PCB.

22. The system of claim 19, further comprising:
at least one additional packaged light source semiconductor device and/or at least one additional packaged light detector semiconductor device; and
a driver to selectively drive one or more light emitting elements of the one or more packaged light source semiconductor devices;

wherein the optoelectronic apparatus comprises
- an optical gesture recognition sensor that can be used to detect a plurality of different gestures; or
- both an optical proximity sensor and an ambient light sensor, wherein the optical proximity sensor can be used to detect the presence, proximity and/or motion of an object within the sense region of the optical proximity sensor.

\* \* \* \* \*